United States Patent [19]
Wills et al.

[11] Patent Number: 5,543,365
[45] Date of Patent: Aug. 6, 1996

[54] WAFER SCRIBE TECHNIQUE USING LASER BY FORMING POLYSILICON

[75] Inventors: Kendall S. Wills, Farmers Branch; Paul A. Rodriguez, Lewisville; Melvin Brewer, Plano, all of Tex.

[73] Assignee: Texas Instruments Incorporated, Dallas, Tex.

[21] Appl. No.: 347,988

[22] Filed: Dec. 2, 1994

[51] Int. Cl.$^6$ .................................................. H01L 21/302
[52] U.S. Cl. ................... 437/226; 437/227; 148/DIG. 28
[58] Field of Search ..................................... 437/226, 227; 148/DIG. 28

[56] References Cited

U.S. PATENT DOCUMENTS

| | | | |
|---|---|---|---|
| 3,991,296 | 11/1976 | Kojima et al. ......................... | 219/121 |
| 4,141,456 | 2/1979 | Hart ....................................... | 214/1 R |
| 4,224,101 | 9/1980 | Tijburg et al. ......................... | 156/643 |
| 4,534,804 | 8/1985 | Cade ...................................... | 148/1.5 |
| 4,543,464 | 9/1985 | Takeuchi ............................... | 219/121 |
| 4,610,079 | 9/1986 | Abe et al. .............................. | 29/583 |
| 4,878,099 | 10/1989 | Nilarp .................................... | 357/71 |
| 4,965,173 | 10/1990 | Gould .................................... | 430/317 |
| 5,104,023 | 4/1992 | Nishiguchi et al. .................... | 225/103 |
| 5,151,584 | 9/1992 | Ebbing et al. ......................... | 250/201.4 |
| 5,256,578 | 10/1993 | Corley et al. .......................... | 437/8 |
| 5,308,222 | 5/1994 | Bacchi et al. ......................... | 414/783 |
| 5,338,967 | 8/1994 | Kosaki ................................... | 437/226 |

*Primary Examiner*—R. Bruce Breneman
*Assistant Examiner*—Ramamohan Rao Paladugu
*Attorney, Agent, or Firm*—W. Daniel Swayze, Jr.; W. James Brady, III; Richard L. Donaldson

[57] ABSTRACT

A channel is formed in a wafer to fore descrite die. A portion of the wafer is heated in the channel. A portion of the heated portion is cooled to eliminate the uniform structure. The cooled portion is scribed to separate the die.

12 Claims, 5 Drawing Sheets

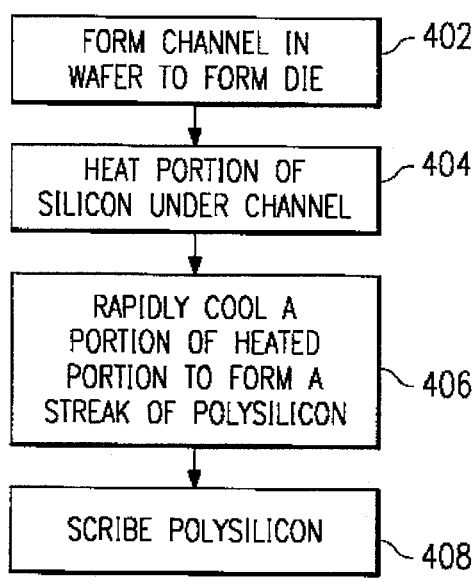
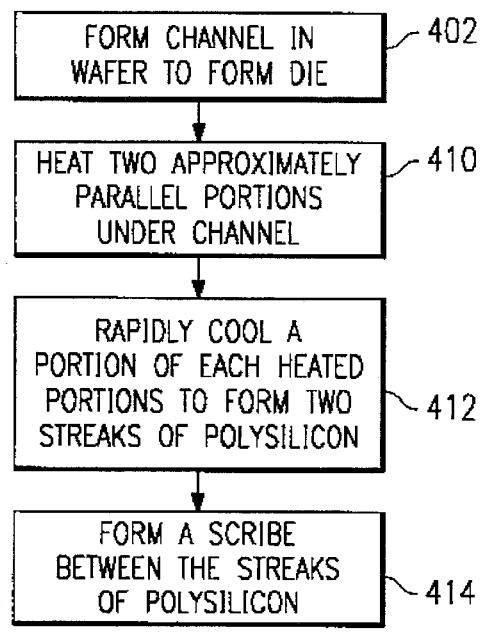
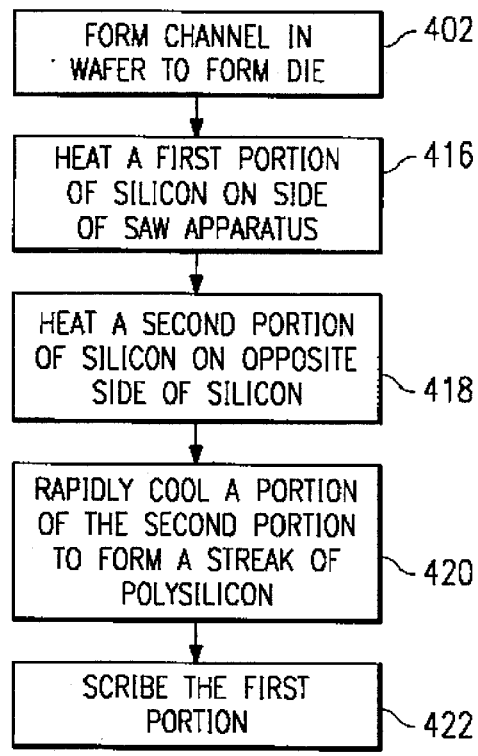

5,543,365

WAFER SCRIBE TECHNIQUE USING LASER BY FORMING POLYSILICON

TECHNICAL FIELD OF THE INVENTION

This invention relates to a method and apparatus for forming grooves on a wafer and more particularly to an apparatus for scribing a semiconductor wafer to divide the wafer into individual chips associated with integrated circuits or circuit elements such as transistors.

BACKGROUND OF THE INVENTION

The semiconductor industry has been known to divide a semiconductor wafer into a number of chips by scribing the wafer with a diamond saw scriber and pressing the wafer locally by a roller over the wafer to break the semiconductor wafer up into chips. This method, however, has numerous drawbacks, for example, scribing is limited to one direction and hence is very inefficient; a continuous scribing line is not available unless the wafer surface is smooth enough and the grooves formed are deep enough to divide the thick wafer. To solve these problems, a scribing apparatus using a laser beam has been proposed in which a laser beam of a given output level is applied directly to the semiconductor wafer, which is held on a stage by vacuum absorption, and the wafer is scribed or grooved by the laser beam as the wafer is moved. With this apparatus, the scribing speed is increased and the continuity of the scribed line is achieved. Moreover, the wafer is scribed deeply.

This prior art, however, using laser technology is disadvantageous in that molten semiconductor debris from the laser beam is scattered during the scribing and adheres to the chip surface on the wafer. The minute semiconductor debris that adheres to the electrodes or metal wiring on the chip will deteriorate the electrical properties of the chips, or ruin the function of the integrated circuit. When using mechanical sawing or scribing techniques chips or chipouts are caused by cracks that radiate away from the scribe in an active duct between the die into the active circuit, for example, the integrated circuit to be formed from the die, such that a portion of the silicon actually breaks out. The formation of these chipouts are facilitated by the structure of the silicon itself. The structure of the silicon is uniform such that the cracks follow the structure of the silicon until the crack has followed the structure of the silicon a sufficient distance which results in a piece of the silicon chipping out.

Even if these cracks do not travel along the structure of the silicon a sufficient distance to create a chipout of the silicon, these cracks can affect the operation of the integrated circuit device formed the die of the silicon. Thus, these cracks cause a defect with or without the chipout.

For example, if the crack extend into the die and does not cause a chip out, the crack remains in the bar during and after the assembly process. This may cause the die to actually crack after assembly inside the package, rendering the die useless.

These types of defects result in lost revenue when the cracked die is discovered before sale, and dissatisfied customers if the defect in the die is not discovered until after the purchase.

It has been recognized that hardening the silicon prevents some of these cracks from forming. This does not prevent all of the cracks from forming. Although these cracks may propogate in any direction. The cracks that propogate into the die cause the problems. The cracks that propogate along the path of the saw are generally less troublesome with respect to chipouts.

In order to protect the surface of the die, the die may be coated with a protection coating material, for example silicon nitride. If this protection coating is removed with the silicon during a chipout, this loss of protection coating may result in reliability of the integrated circuit is adversely affected. The removal of the protection layer expose the enter level oxides within the die and results the migration of sodium ionic contaminate, sodium being one possibility to the exterior of the die and then migrate along the interface of the inter-level oxide. This creates an inversion since the sodium enters the actual transistor.

SUMMARY OF THE INVENTION

The present invention reduces or eliminates the number of chipouts and consequently reduces or eliminates the number of integrated circuits that are created having a defect due to either the cracking or splitting of the silicon. The chipouts or cracks are prevented by providing a portion of the silicon which is formed polysilicon that interrupts the formation of the cracks that radiate from the scribed surface. This portion of the silicon is positioned in a channel that surrounds the die which my be formed into the integrated circuits. This portion of the silicon forms a guard band to protect the die from chipouts and cracks in the silicon which are transmitted to the silicon. The present invention provides the channel for a streak of the polysilicon along or adjacent to the area which is to be scribed. The channel of polysilicon may be formed from a laser which heats the silicon and which has been subsequently cooled to form the polysilicon. These streaks of polysilicon are formed around the die which are to be formed into the integrated circuits. Alternately, channels of polysilicon can be formed on each side of the scribe. The streaks of polysilicon may be a single streak of polysilicon formed in the channel sufficiently wide so that the wafer may be scribed such that a steak of polysilicon remains on either side of the sides. Alternately, two steaks may be formed in the channel that are approximately parallel, so that the wafer may be scribed between the streaks.

The present invention may also include two streaks of polysilicon that are formed on opposite sides of the silicon. These streaks are formed by two lasers on opposing sides of the wafer. These lasers may cut to varying depth with the silicon. The laser beam on one side of the silicon may provide a cut just sufficient to mark the surface of the silicon, while the laser on the opposite side of the silicon may make a relatively deep cut with respect to the depth of the silicon. A problem with the use of the laser making a deep cut is the quantity of slaging or molten silicon resulting fore the deep cut. By limiting the laser to a deep cut to one side of the wafer, particularly the underside of the wafer, there is minimal slag generated. The slag falls away from the wafer due to gravity, further, cooling gas may be applied to the first side, while cooling gas or water may be applied to the later side.

Alternatively, tape may be positioned on either side of the silicon.

BRIEF DESCRIPTION OF THE DRAWINGS

These and other advantages and features of the present invention will become clear from the following description taken in conjunction with the brief description of the drawings in which:

FIG. 15 illustrates the steps for one method of the present invention;

FIG. 16 illustrates the step for another method of the present invention; and

FIG. 17 illustrates the step for a third method of the present invention.

DETAILED DESCRIPTION OF THE INVENTION

Figure 1:
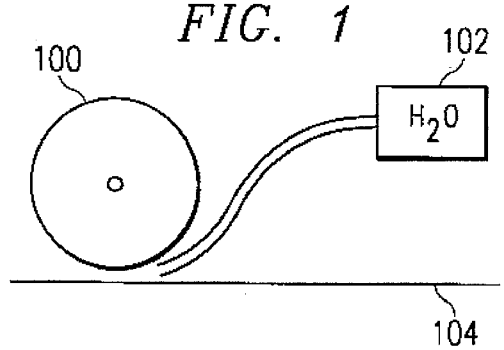
FIG. 1 is a schematic view of a saw and cooling apparatus.
Figure 2:
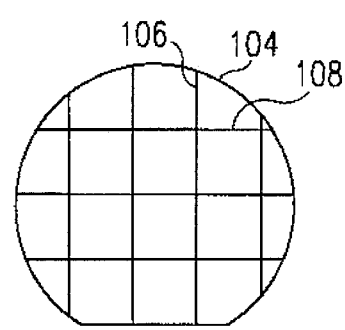
FIG. 2 is a top view of a silicon wafer illustrating vertical and horizontal scribes.
Figure 3:
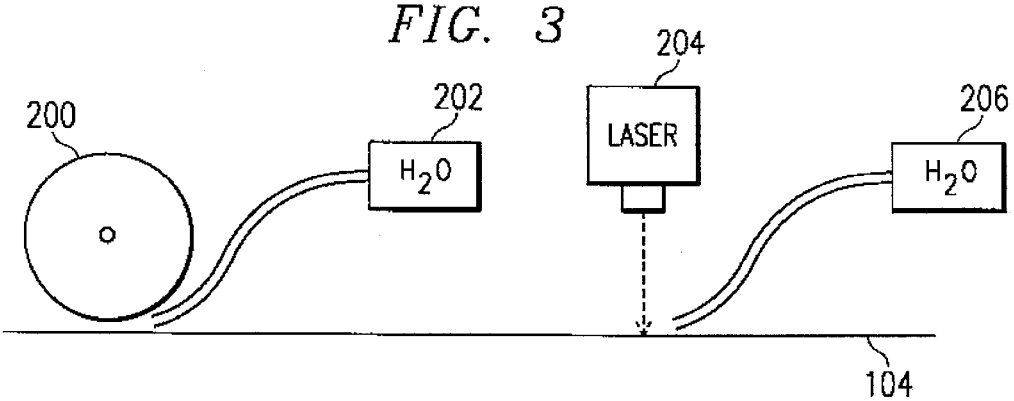
FIG. 3 is a schematic view of a saw and polysilicon forming apparatus.
Figure 6:
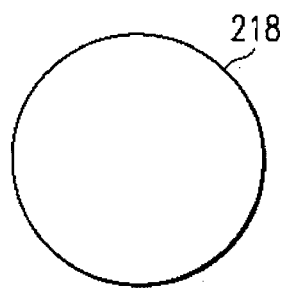
FIG. 6 illustrates a cross-section of silicon which has been heated.
Figure 7:
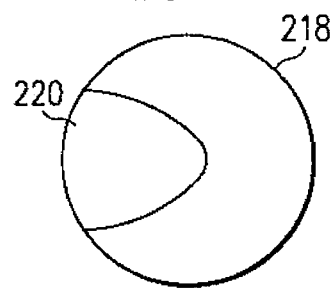
FIG. 7 illustrates a cross-section of silicon that has the portion of the silicon heated with a second portion which has been cooled.
Figure 8:
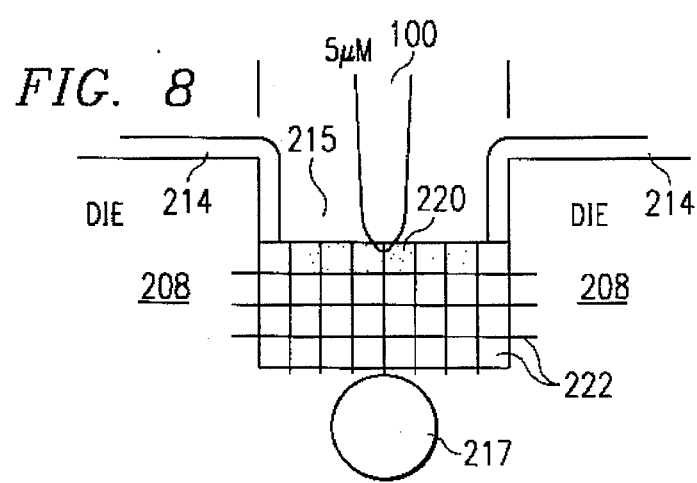
FIG. 8 illustrates a cross-section of silicon illustrating the uniform structure of the silicon with the channel of polysilicon.

Descrite die are formed by forming a channel; the channel may be formed by etching the silicon in the areas between the die. A streak of polysilicon is formed within the channel by jumbling or randomizing the uniform structure 222 of the silicon as illustrated in FIG. 8. Referring now to FIG. 3, the apparatus 204 for heating a portion of the die, for example a laser, heats a portion of the die 104. FIG. 6 illustrates a heated portion 218 of the silicon wafer that results from the application of the laser to the wafer. An apparatus 206 to cool an additional portion 220 (see FIG. 7) is illustrated. Thus, the heating apparatus 204 heats a portion 218 of the wafer while the cooling apparatus 206 cools the additional portion 220 of the wafer to form the polysilicon within the additional portion 222. In this manner a streak of polysilicon is formed of sufficient width so that the die is protected from any cracks that may be formed during the formation of the scribe. A guard band of protection from the die is formed around each die by moving the apparatus 204 and apparatus 206 along the perimeter of each of the die. After the polysilicon has been formed, the scribing apparatus 200 to scribe the semiconductor surface moves along the wafer of polysilicon in order to produce a scribe. An additional cooling apparatus 202 cools the polysilicon near the area of the cut before the scribing apparatus 200 scribes the surface. The width of the polysilicon streak should be wider than the width of saw apparatus 200, but not wider than the channel.

Thus, as the scribing apparatus 200 cuts the polysilicon wafer at the streak, few or no chipouts occur. While a continuous low power laser may form the polysilicon streak, a pulsing laser may be employed with a pulsing laser beam that may be limited exceed 4 nano seconds with sufficient power to vaporize the silicon. The wave length of the laser beam may be for a Nd: YAG 1.$\phi$6 micron. The frequency of a doubled Nd: YAG laser may have a wave length of 0.53 micron. The focus of the beam of the laser may be on the surface of the wafer or may be focused within the wafer. The deeper the focus of the layer within the wafer, the deeper the molten pool of silicon material and the larger the streak of polysilicon. The width of the streak of polysilicon should be larger than the cross-sectional area of the apparatus to saw the silicon so that the streaks of polysilicon are located on both sides of the scribe. The rapid cooling of the molten material forces the material to cool in a random matter, avoiding the uniform structure of the silicon to form the polycrystalline material. The heated portion 118 may be formed by first heating only the top 1 μm of the surface of the wafer. Alternatively, the portion 218 is formed by focusing a laser, for example heating apparatus 204 mounted on either side of the wafer, at any point from the bottom of the wafer to a point 1 μm below the surface of the wafer. The laser light should be at least partly absorbing with respect to Si. The rapid cooling from the cooling apparatus 206 forms the polycrystalline.

FIG. 8 illustrates that the polysilicon 220 has been formed in a channel 215 of the silicon wafer, and the channel 215 of the silicon wafer is approximately 5 MILS in width. FIG. 8 additionally illustrates the uniform structure 222 of the silicon wafer. The die of the silicon wafer is protected by the area of protective coating 214. The protective coating 214 protects the die from flying chipouts when they strike the surface, the protective coating also prevents ionic contamination from migrating into the die and molten silicon when they strike the surface. Dies are covered by a protective coating for example silicon nitride 214.

Figure 4:
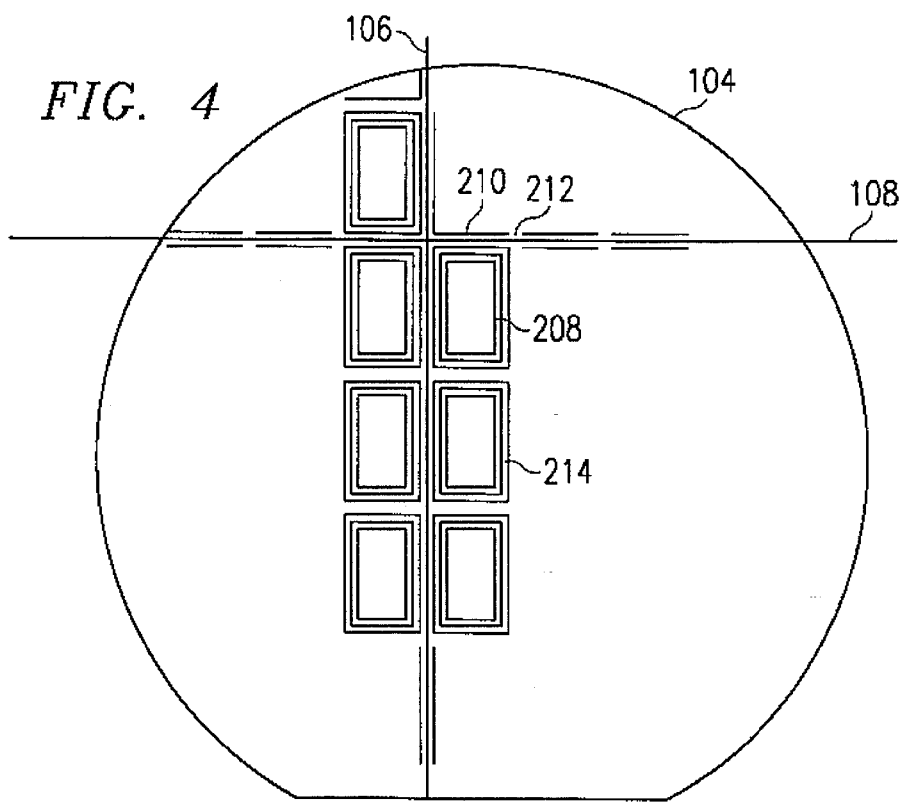
FIG. 4 is a top view of the silicon illustrating the scribes, and polysilicon channels.
Figure 5:
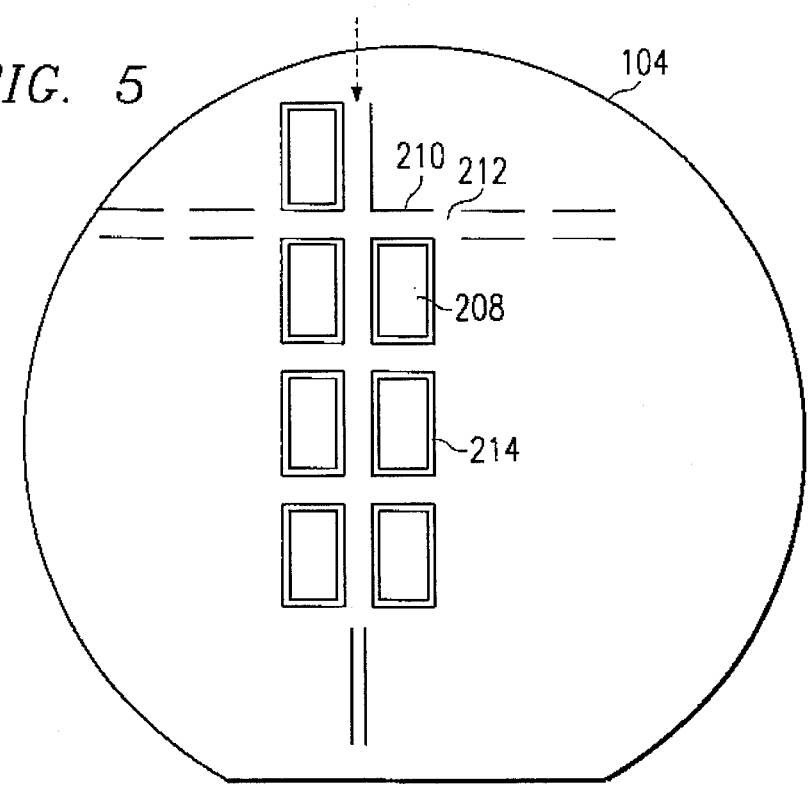
FIG. 5 illustrates the polysilicon channel with gaps.

FIGS. 4 and 5 illustrate gaps 212 formed in two parallel streaks of polysilicon 210. Two lasers maybe employed to form the two parallel streaks of polysilicon along each side of a scribe. Each of the streaks of polysilicon 210 has a gap of structured silicon between the other streaks of polysilicon. It is not necessary that the streaks of polysilicon be continuous since a scribe will be positioned with these gaps and the die 208 are for the most part surrounded by the streaks 214 of polysilicon. The scribe, either scribe 108 or 106, is positioned between the two scribes of polysilicon. In order to form the gaps in the beam of laser is interrupted as it travels along paths of the silicon wafer to be scribed to form the gaps 212 in the streaks of polysilicon 210. These gaps allow the die of semiconductor wafer 208 to be completely surrounded by the channel polysilicon 210. Furthermore, the gaps 212 saves power and operation time of the laser. The gaps 212 of polysilicon indicate crossings of the horizontal scribe 108 and the vertical scribe 106.

Figure 9:
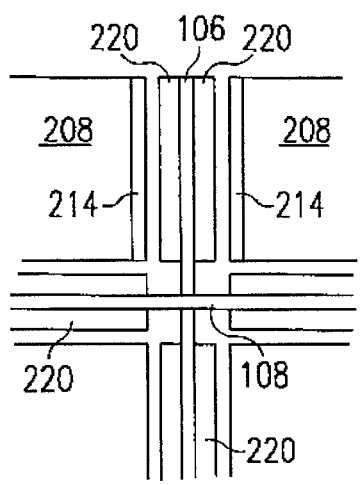
FIG. 9 illustrates a top view of the wafer the polysilicon form with a scribe.
Figure 10:
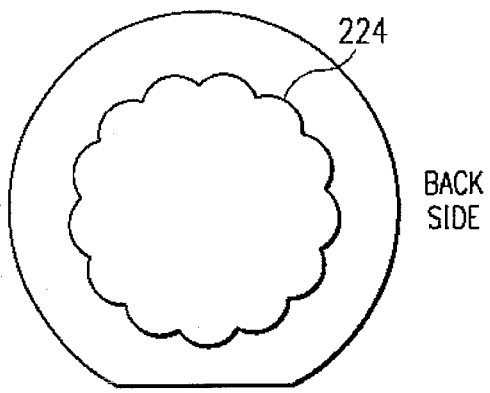
FIG. 10 illustrates the reverse side of silicon with a ring of polysilicon.

FIG. 9 illustrates an intersection of two scribes 106 and 108. The scribe 106 is formed within the polysilicon 220 and between adjacent protective layers 214. Within the gap of the polysilicon 220, the scribe 106 intersects with the scribe 108. FIG. 10 illustrates that the back side of the silicon may have a ring 224 of polysilicon formed.

Figure 11:
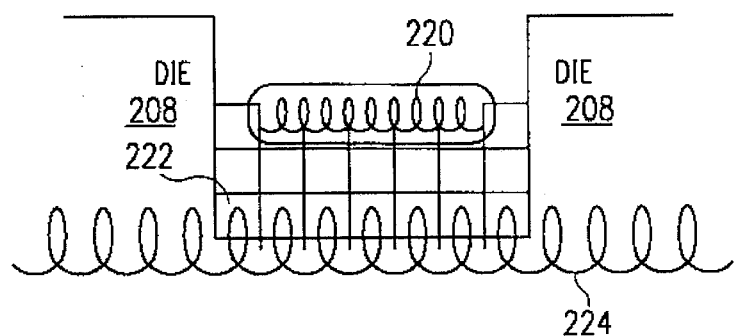
FIG. 11 illustrates a cross-section of the silicon with a streaks of polysilicon formed on one side of the silicon and the ring of polysilicon formed on the opposite side.

FIG. 11 illustrates that when a ring 224 of polysilicon is formed on the backside or opposite side of the channel between the die 208. This ring 224 prevents cracks from radiating across a wafer. Thus, the effect of the streak of polysilicon 200 acts the same as the ring 224, of polysilicon and a significant reduction of cracks.

Figure 12:
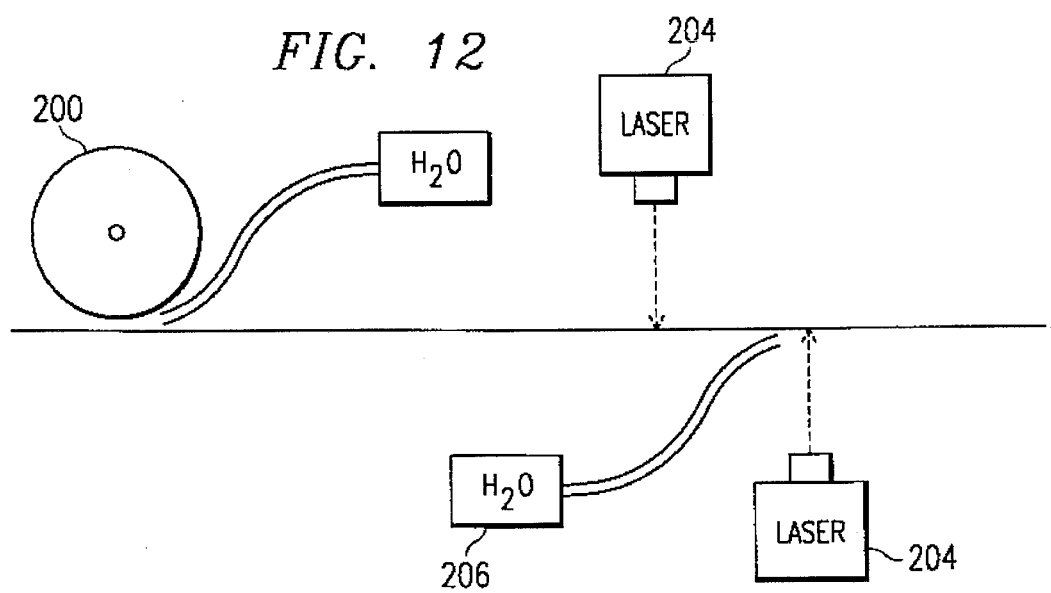
FIG. 12 illustrates another embodiment of the present invention with two lasers.
Figure 13:
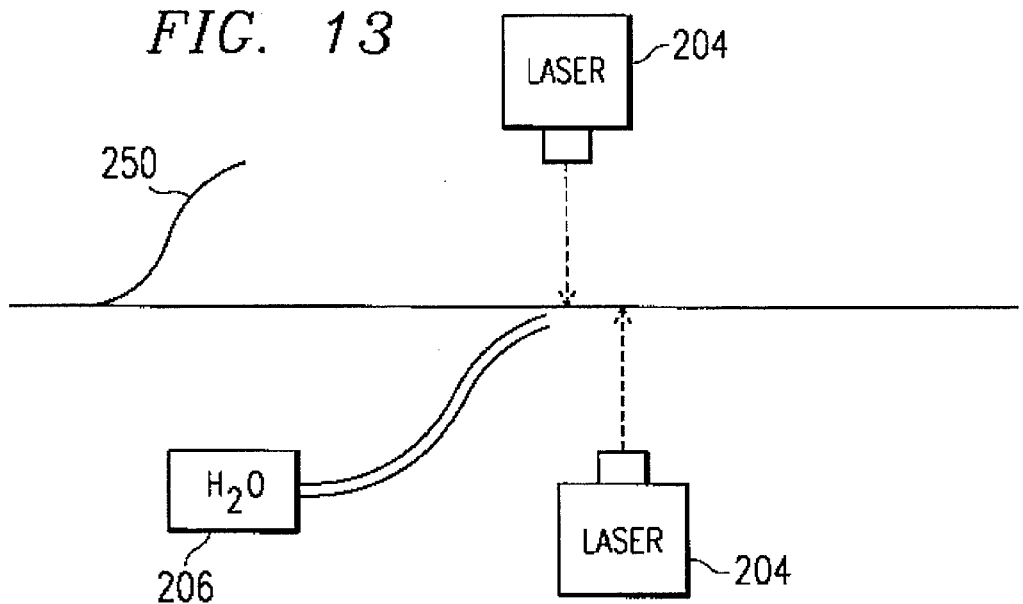
FIG. 13 illustrates another embodiment of the present invention with two lasers and tape on one side of the silicon.

FIGS. 12 and 13 illustrate two apparatuses for forming the streak 220 and the ring 224 of polysilicon.

FIG. 12 illustrates an alternate apparatus and method for forming polysilicon on both sides of the wafer. The laser 204 on the opposite side of the saw apparatus 200 forms a deep cut on the back side of the silicon. The cooling apparatus 206 may use water for cooling or employ cooling gas such as $O_2$ or $CF_4$. The laser 204 on the same side of the wafer as the saw apparatus 200 forms the streak of polysilicon. Little or no silicon is removed from the wafer as a result of this operation. Furthermore, tape 250 having adhesive surface to hold the wafer is used to mount the wafer on a flexible frame in preparation for sawing. On the back side of the silicon the second laser device is operated with sufficient power to vaporize the silicon from the wafer. The gas or water is used to help remove any vaporized silicon from the sawed silicon. The debris from the vaporization falls away from the silicon wafer by gravity. With this alternate apparatus, the laser 204 on the side of the same apparatus 200 operates in the same manner as previously described. However, this apparatus of laser 204 on the side of its saw apparatus 200 may be modified as follows. Alternatively, the laser 202 on the same side of the wafer as the saw apparatus 200 may have sufficient power so as to vaporize the silicon. The tape may be cut by the laser 204 on the back side of the silicon.

Another technique, as illustrated in FIG. 13, is to employ two lasers, each on opposite sides of the wafer, however no saw is used. The laser 204 on the underside of the wafer with respect to gravity cuts from 50 to 95% of the wafer, and the laser 204 on the top side of the wafer the remainder of the wafer. Another alternative is to turn the wafer upside down and perform any of the above techniques. This allows gravity to remove some of the silicon slag and prevent damage.

Optical devices or alternatively IR devices can be used to align the scribe apparatus to the streaks of polysilicon. Additional gases and liquids can be used to perform the cooling. However, liquids with Cl could contaminate the silicon wafer corroding the metals of the exposed areas on the die. Gases and liquids might be air, water, fluorocarbons, or inert gases. The fluorine from the fluorocarbon could help the material removal process by reacting with the wafer material reducing the chipouts and slag.

Although the present invention has been described in the production of dies, leadframes may fully be produced with the above described process.

Figure 14:
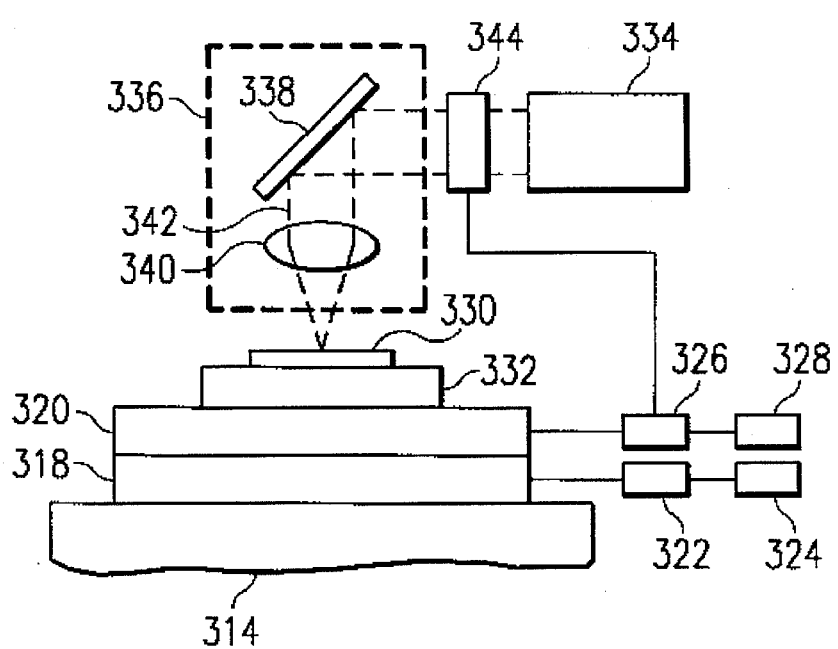
FIG. 14 illustrates a laser which may be used with the present invention.

FIG. 14 illustrates a typical laser device.

Referring to FIG. 14, an apparatus includes a support base 314 on which an XY table assembly 316 is placed. The XY table assembly 316 includes a first table 318 movable in a X axis direction of XY coordinate axis and a second table 320 movable in a Y axis direction of the same coordinate system. The X table 318 is connected to and driven by a pulse motor 322. The pulse motor 322 is connected to a pulse generator 324. The Y table 320 is connected to and driven by a DC motor 326, which in turn is connected to a DC converter 328. A vacuum chuck 332, which can rotate at least 90° is placed on the Y table 320 to permit a wafer 330 to be fixed thereon. A laser beam oscillator 334 is located on a diagonal upper side of the Y table 320. An optical system 336 is located above the Y table 320 to permit the laser beam horizontally emitted from the laser beam oscillator 334 to be directed into the wafer 330 fixed on the chuck 332. The optical system 336 includes a reflective plate 338 for permitting the direction of a laser beam horizontally emitted from the laser beam oscillator 334 to be bent through an angle of 90° and a lens 340 for focusing the laser beam 342 reflected by the reflective plate 338 on the wafer 330. A light interrupting switch may be disposed on the optical path of the laser beam to control the light, which in turn is controlled by a computer.

A semiconductor substrate of a semiconductor device is formed by cutting a disk-like semiconductor wafer along dicing lines. The step of cutting is performed by cutting grooves along the dicing lines in the surface of the semiconductor wafer and breaking off the wafer along the grooves to separate it from the rest of the wafer. Scribing refers to grooving the semiconductor along the dicing lines.

FIG. 15 illustrates the steps of the present invention. Block 402 illustrates that a channel is formed in the wafer to form a die. Block 404 illustrates that a portion of the silicon under the channel is heated. Block 406 illustrates that the portion of the heated portion is rapidly cooled to form a streak of polysilicon. Block 408 illustrates that the polysilicon is scribed.

In FIG. 16, the method steps of another aspect of the present invention is illustrated. In Block 410, two approximately parallel portions are heated. Block 412 illustrates that a portion of each of the heated portions are rapidly cooled to form two approximately parallel streaks of polysilicon. Block 414 illustrates that a scribe is formed between the steaks of polysilicon.

FIG. 17 illustrates a third method of the present invention. Block 416 illustrates that a first portion on the side of the saw apparatus is heated. Block 418 illustrates that a second portion of silicon is heated on the opposite side of the silicon. Block 420 illustrates that a portion of the second portion is rapidly cooled to form a streak of polysilicon. Block 422 illustrates that the first portion is scribed.

The laser beam can be derived from any known neodymium laser oscillator using neodymium-YAG, neodymium-YAD where the like as host material such neodymium laser emits a beam having a wave length of about 1.06 micron. Any laser may be used as long as the wafer material can absorb some or all of the laser light energy. Although, the present invention has been described in terms of silicon other crystalline materials such as GaAs and Sapphire may be used. A laser beam having a wave length more than 20 microns is generally not suitable.

What is claimed is:

1. A method for preventing cracks as a result of a scribing operation, comprising the steps of:

forming a channel in a wafer to provide descrite die;

heating a first portion of said wafer under the channel cooling a second portion of said first portion to form a polysilicon structure that eliminates the uniform structures of said wafer of silicon within the second portion;

scribing said second portion in order to separate said die.

2. A method for preventing cracks as in claim 1, wherein said cooling step includes the step of cooling with water.

3. A method for preventing cracks as in claim 1, wherein said heating step includes the step of heating with a laser.

4. A method for preventing cracks as in claim 1, wherein said forming step includes the step of forming said channel by etching.

5. A method for preventing cracks as a result of a scribing operation, comprising the steps of:

forming a channel in a wafer to provide descrite die;

heating a first portion of said wafer under the channel;

heating a second portion of said wafer under the channel;

cooling a third portion and fourth portion of said wafer of said first and second portion respectively to form a polysilicon structure within the first and second portion structure that eliminates the uniform structure of the wafer of silicon.

6. A method for preventing cracks as in claim 5, wherein said cooling step includes the step of cooling said third portion and said fourth portion with water.

7. A method for preventing cracks as in claim 5, wherein said heating step includes the step of heating with a laser.

8. A method for preventing cracks as in claim 5, where said forming step includes the step of forming said channel by etching.

9. A method for preventing cracks as a result of a descrite operation, comprising the steps of:

forming a channel in a wafer to provide descrite die;

heating a first portion of said wafer under the channel on a first side of said wafer;

heating a second portion of said wafer on a second side of said wafer; and cooling a third portion of said second portion to form a polysilicon structure eliminates the uniform structure of said wafer of silicon within the third portion scribing said third portion in order to separate said die.

10. A method for preventing cracks as in claim 9, wherein said cooling step includes the step of cooling with water.

11. A method for preventing cracks as in claim 9, wherein said heating step includes the step of heating with a laser.

12. A method for preventing cracks as in claim 9, wherein said forming step includes the step of forming said channel by etching.

* * * * *